(12) United States Patent
Canas et al.

(10) Patent No.: US 12,210,042 B2
(45) Date of Patent: Jan. 28, 2025

(54) MAGNETO-OPTIC CURRENT TRANSFORMER, AND METHOD FOR MEASURING A CURRENT INTENSITY

(71) Applicant: HSP Hochspannungsgeräte GmbH, Troisdorf (DE)

(72) Inventors: Federico Canas, Falkensee (DE); Thomas Judendorfer, Bayern (DE); Stefan Schuberth, Bavaria (DE)

(73) Assignee: HSP Hochspannungsgeräte GmbH, Troisdorf (DE)

( * ) Notice: Subject to any disclaimer, the term of this patent is extended or adjusted under 35 U.S.C. 154(b) by 120 days.

(21) Appl. No.: 18/017,406

(22) PCT Filed: Jul. 28, 2021

(86) PCT No.: PCT/EP2021/071207
§ 371 (c)(1),
(2) Date: Jan. 22, 2023

(87) PCT Pub. No.: WO2022/023445
PCT Pub. Date: Feb. 3, 2022

(65) Prior Publication Data
US 2023/0296650 A1 Sep. 21, 2023

(30) Foreign Application Priority Data
Jul. 31, 2020 (DE) .................. 10 2020 209 699.6

(51) Int. Cl.
*G01R 15/24* (2006.01)
*G01R 19/00* (2006.01)

(52) U.S. Cl.
CPC ......... *G01R 15/246* (2013.01); *G01R 15/247* (2013.01); *G01R 19/0092* (2013.01)

(58) Field of Classification Search
CPC . G01R 15/246; G01R 15/247; G01R 19/0092
See application file for complete search history.

(56) References Cited

U.S. PATENT DOCUMENTS 5,136,235 A * 8/1992 Brandle ............... G01R 15/246
356/477
6,515,467 B1 2/2003 Bosselmann
(Continued)

FOREIGN PATENT DOCUMENTS

| CH | 659329 A5 | 1/1987 |
| DE | 19653255 A1 | 6/1997 |

(Continued)

OTHER PUBLICATIONS

PCT International Search Report and Written Opinion of International Searching Authority mailed Nov. 19, 2021 corresponding to PCT International Application No. PCT/EP2021/071207 filed Jul. 28, 2021.

*Primary Examiner* — Jermele M Hollington
*Assistant Examiner* — Zannatul Ferdous
(74) *Attorney, Agent, or Firm* — David R. Stevens; Stevens Law Group

(57) ABSTRACT

A magneto-optic current transformer for measuring a current intensity of an electric current in an electrical conductor includes two light-guide units, each with an input polarizer, an output polarizer and a light guide arranged between the input and the output polarizer. A light-supply device is included which is configured to supply light to the light-guide units on the input side, and an analysis device which is configured to measure a luminous intensity of light output by the light-guide unit at the output side for each light-guide unit and to ascertain the current intensity of the electric current through the electrical conductor from the measured luminous intensities. A polarization axis of the output polarizer of each light-guide unit is rotated through a polarization angle in relation to a polarization axis of the input polarizer of the light-guide unit and the polarization angles of the two light-guide units differ from one another.

11 Claims, 3 Drawing Sheets

(56) References Cited

U.S. PATENT DOCUMENTS

| | | | |
|---|---|---|---|
| 2002/0027659 A1* | 3/2002 | Dyott | H01S 5/065 |
| | | | 356/483 |
| 2015/0168318 A1* | 6/2015 | Beckman | H01J 49/0431 |
| | | | 250/311 |
| 2016/0153894 A1* | 6/2016 | Cho | G01J 4/00 |
| | | | 356/364 |

FOREIGN PATENT DOCUMENTS

| | | |
|---|---|---|
| DE | 202014009595 U1 | 2/2016 |
| EP | 0088419 A1 | 9/1983 |
| EP | 1145020 A1 | 10/2001 |
| JP | H07333569 A | 12/1995 |
| WO | 9838517 A1 | 9/1998 |

* cited by examiner

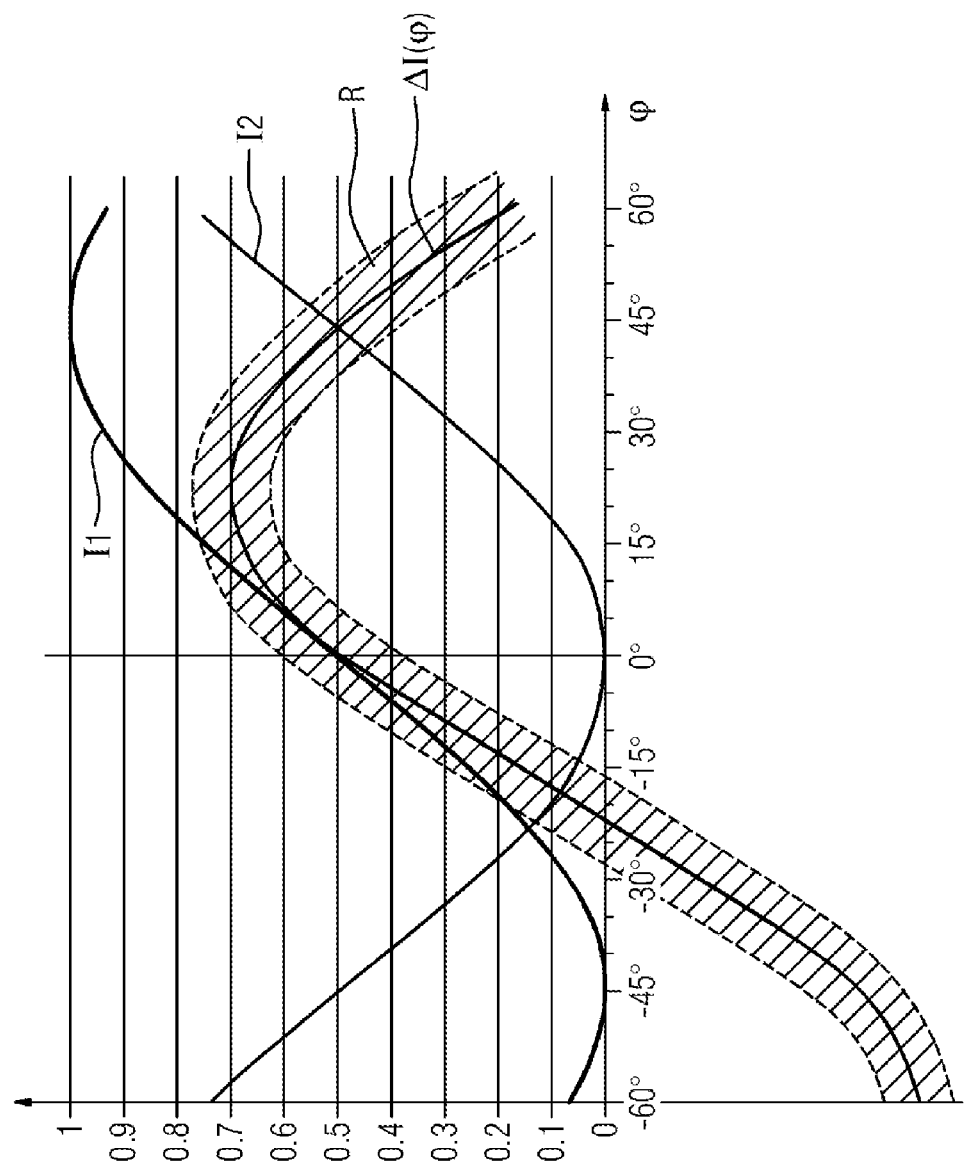

ial Application No. PCT/EP2021/071207 filed 28 Jul. 2021,
MAGNETO-OPTIC CURRENT TRANSFORMER, AND METHOD FOR MEASURING A CURRENT INTENSITY

CROSS REFERENCE TO RELATED APPLICATIONS

This application is the US National Stage of International Application No. PCT/EP2021/071207 filed 28 Jul. 2021, and claims the benefit thereof. The International Application claims the benefit of German Application No. DE 10 2020 209 699.6 filed 31 Jul. 2020. All of the applications are incorporated by reference herein in their entirety.

FIELD OF INVENTION

The invention relates to a magneto-optic current transformer and a method for detecting a current intensity of an electric current in a current conductor by means of a magneto-optic current transformer.

BACKGROUND OF INVENTION

A magneto-optic current transformer is understood here to mean an optical measuring device for measuring an electric current in a current conductor, which device is based on the magneto-optic Faraday effect. The Faraday effect is understood to mean the rotation of the polarization direction of a linearly polarized electromagnetic wave in a medium by a magnetic field parallel to the direction of propagation of the wave. In this case, the rotation of the polarization direction is proportional to the magnetic flux density of the magnetic field.

In the case of a magneto-optic current transformer, linearly polarized light is guided through a light guide arranged in the vicinity of the current conductor and exhibiting the Faraday effect. The magnetic field generated by the current in the current conductor brings about a rotation of the polarization direction of the light in the light guide. Since the magnetic flux density of the magnetic field in the light guide depends on the current intensity of the current in the current conductor, the current intensity can be measured by detecting the rotation of the polarization direction of the light in the light guide. In order to detect the rotation of the polarization direction, the light output by the light guide is passed through an output-side polarizer, for example, and a light intensity of the light transmitted by the polarizer is detected.

In the case of this measuring method, problems arise, however, if the polarization direction is rotated to just such an extent that it is orthogonal or almost orthogonal to the polarization axis of the output-side polarizer. In that case, no or almost no light is transmitted by the polarizer, and the measurement signal is zero or almost zero and thus difficult to distinguish or not distinguishable at all from a noise signal. Furthermore, a distinction cannot be drawn, or cannot reliably be drawn, between a current intensity which leads to this rotation of the polarization direction and the case in which no light at all is fed to the light guide, for example because a light feed to the light guide is interrupted (e.g. in the case of a break in an optical waveguide used for the light feed) or the current transformer has some other defect (e.g. a failure of a light source). Moreover, the light intensity of the light output by a light guide unit is a periodic function of the angle of rotation by which the polarization direction of the light is rotated during passage through the light guide of the light guide unit. As a result, an unambiguous assignment of the light intensity of the light transmitted by the polarizer to a current intensity of the current through the current conductor is possible only for a restricted range of values of the angle of rotation. These problems restrict the measurement range in which the current transformer is usable.

SUMMARY OF INVENTION

The invention is based on the object of specifying a magneto-optic current transformer and a method for detecting a current intensity of an electric current in a current conductor by means of a magneto-optic current transformer which are improved in respect of an extension of the measurement range of the current transformer.

The object is achieved according to the invention by means of a magneto-optic current transformer and a method having the features of the independent claim(s).

The dependent claims relate to advantageous configurations of the invention.

A magneto-optic current transformer according to the invention for detecting a current intensity of an electric current in a current conductor comprises two light guide units, each having a linear input polarizer, a linear output polarizer and a light guide arranged between the input polarizer and the output polarizer in the region of the current conductor, said light guide exhibiting the Faraday effect and being configured to feed light transmitted by the input polarizer to the output polarizer. Furthermore, the current transformer comprises a light supply device configured to feed light to the light guide units on the input side, and an analysis device configured to detect for each light guide unit a light intensity of light output by the light guide unit on the output side, and to determine the current intensity of the electric current through the current conductor from the detected light intensities. In this case, a polarization axis of the output polarizer of each light guide unit is rotated by a polarization angle relative to a polarization axis of the input polarizer of the light guide unit, and the polarization angles of the two light guide units differ from one another.

In this case, the rotation of the polarization axis of the output polarizer relative to the polarization axis of the input polarizer of a light guide unit is defined by an angle between the polarization axis of the output polarizer and the polarization direction exhibited by light at the output of the output polarizer, said light being polarized parallel to the polarization axis of the input polarizer, if the polarization direction of the light upon passing through the light guide of the light guide unit is not rotated by the Faraday effect, that is to say that if no current is flowing in the current conductor.

A magneto-optic current transformer according to the invention thus has two light guide units having mutually different polarization angles. This embodiment of the current transformer has a number of advantages. Firstly, it makes it possible to enlarge the measurement range of the current transformer relative to an embodiment having only one light guide unit. As has already been explained above, the light intensity of the light output by a light guide unit is a periodic function of the rotation angle of the rotation of the polarization direction of the light in the light guide. Therefore, the measurement range of a current transformer having only one light guide unit has to be restricted to a specific angle range of the angle of rotation or to currents associated therewith in the current conductor, in order that a current intensity of a current in the current conductor is unambiguously assigned to a light intensity output by the light guide unit.

The use of two light guide units having mutually different polarization angles makes it possible to shift the characteristic curves of the light guide units with respect to one another, said characteristic curves describing the light intensities as a function of the angle of rotation. What can be achieved as a result is that two different values of the angle of rotation to which the same light intensity is assigned by the characteristic curve of one of the light guide units are assigned different light intensities by the characteristic curve of the other light guide unit. The ambiguity of the characteristic curve of one light guide unit can thus be resolved by the characteristic curve of the other light guide unit, with the result that the measurement range can advantageously be extended.

Furthermore, the use of two light guide units having different polarization angles can be utilized for identifying defects of the current transformer and solving the above-described problems (poor signal-to-noise ratio, difficult identification of a defect of the current transformer) which arise with the use of only one light guide unit in the case where the polarization direction of the light in the light guide is rotated to just such an extent that it is orthogonal or almost orthogonal to the polarization axis of the output polarizer. By way of example, with the use of two light guide units having different polarization angles, what can be achieved is that the characteristic curve of one of the two light guide units assigns a light intensity that is appreciably different from zero to values of the angle of rotation to which the characteristic curve of the other light guide unit assigns a completely or almost vanishing light intensity. What can thus be achieved is that a sufficiently high light intensity is assigned to each value of the angle of rotation by at least one of the two characteristic curves. As a result, for each value of the angle of rotation a sufficient signal-to-noise ratio can be attained and a defect of the current transformer can be reliably identified, for example if neither of the two light guide units outputs light.

In one configuration of the current transformer according to the invention, the light guides of the two light guide units are embodied identically. This facilitates the evaluation and the comparison of the measurement signals detected for the two light guide units, and also the setting of a defined difference between the polarization angles of the light guide units.

In a further configuration of the current transformer according to the invention, the light guide of each of the two light guide units runs around the current conductor in a ring-shaped manner. As a result, the measurement of the current intensity of the current in the current conductor becomes largely independent of the position of the current conductor relative to the light guide units and the influence of external fields on the measurement is reduced.

In a further configuration of the current transformer according to the invention, the light guide of each of the two light guide units is fabricated from a glass, for example from optical flint glass. This has the advantage over the use of fiber-optic light guides, for example, that there is no need to use more expensive optical waveguides as light guides which maintain a linear polarization of the light.

In a further configuration of the current transformer according to the invention, the absolute value of the polarization angle of at least one light guide unit is at least approximately 45 degrees. As a result, the operating point of the detection of the light emerging from the light guide unit in the case of vanishing current in the current conductor is advantageously put into a steeply rising or falling region of the characteristic curve of the light guide unit and the measurement sensitivity at this operating point is thus optimized. In particular, by means of the light guide unit advantageously for both current directions of current (in particular of alternating current) in the current transformer it is possible to achieve an at least approximately identical measurement sensitivity and to reliably distinguish between the two current directions.

In a further configuration of the current transformer according to the invention, the analysis device has a photodetector for each light guide unit, said photodetector being configured to detect the light intensity of light output by the light guide unit on the output side. As a result, advantageously easily evaluable electrical measurement signals are assigned to the light intensities output by the light guide units.

In a further configuration of the current transformer according to the invention, the light supply device has a light source, for example a light emitting diode, for each light guide unit and is configured to feed light generated by the light source to the light guide unit. As a result, the current transformer can continue to be operated with at least one of the two light guide units even in the event of failure of one of the two light sources.

In the method according to the invention for detecting a current intensity of an electric current in a current conductor by means of a magneto-optic current transformer according to the invention, light is fed to each of the two light guide units of the current transformer by means of the light supply device of the current transformer. Furthermore, by means of the analysis device of the current transformer, for each light guide unit a light intensity of light output by the light guide unit on the output side is detected, and the current intensity of the electric current through the current conductor is determined from the detected light intensities.

The advantages of the method according to the invention correspond to the abovementioned advantages of a current transformer according to the invention.

In one configuration of the method according to the invention, a tolerance range for a difference between the light intensities detected for the two light guide units is predefined, and a defect of the current transformer is deduced if the difference between the light intensities detected for the two light guide units lies outside the tolerance range. In particular, the tolerance range can be predefined depending on the light intensity of light output by one of the two light guide units.

The abovementioned configuration of the method according to the invention exploits the fact that the characteristic curves of the two light guide units, for all values of the angle of rotation, define a difference characteristic curve which, for each value of the angle of rotation, indicates a difference between the light intensities which the two characteristic curves respectively assign to this value of the angle of rotation. A great deviation from said difference characteristic curve by a difference between the light intensities detected for the two light guide units can thus indicate a defect of the current transformer. In particular, the tolerance range for the difference between the light intensities detected for the two light guide units can therefore be predefined as a range around the difference characteristic curve. The width of the tolerance range around the difference characteristic curve can take into account for example the measurement accuracies of the detection of the light intensities.

BRIEF DESCRIPTION OF THE DRAWINGS

The above-described properties, features and advantages of this invention and the way in which they are achieved will become clearer and more clearly understood in association with the following description of exemplary embodiments which are explained in greater detail in association with the drawings, in which:

FIG. 3 shows a diagram having characteristic curves of one exemplary embodiment of a magneto-optic current transformer.

DETAILED DESCRIPTION OF INVENTION

Mutually corresponding parts are provided with the same reference signs in the figures.

Figure 1:
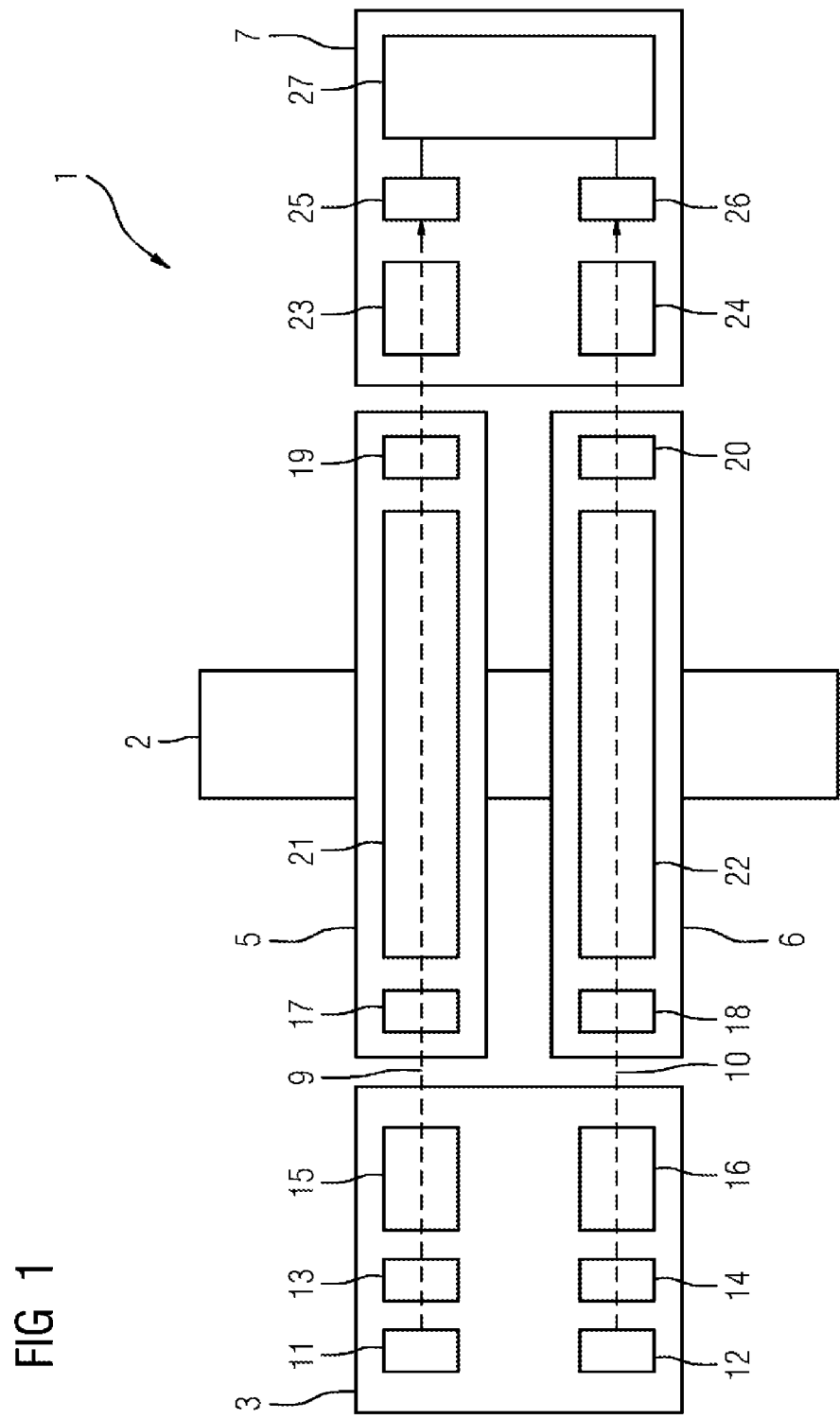
FIG. 1 shows a block diagram of one exemplary embodiment of a magneto-optic current transformer.

FIG. 1 (FIG. 1) shows a block diagram of one exemplary embodiment of a magneto-optic current transformer 1 for detecting a current intensity of an electric current in a current conductor 2. The current transformer 1 comprises a light supply device 3, two light guide units 5, 6 and an analysis device 7.

The light supply device 3 is configured to feed light 9, 10 to the light guide units 5 on the input side. The light supply device 3 comprises for each light guide unit 5, 6 a light source 11, 12, a collimator unit 13, 14 and an optical waveguide 15, 16 on the input side (relative to the light guide unit 5, 6). Each light source 11, 12 is designed in each case as a light emitting diode, for example. Each collimator unit 13, 14 focuses light 9, 10 generated by a light source 11, 12 and feeds the light 9, 10 into an optical waveguide 15, 16. Each optical waveguide 15, 16 forwards the light 9, 10 fed to it to a light guide unit 5, 6.

Each light guide unit 5, 6 comprises a linear input polarizer 17, 18, a linear output polarizer 19, 20 and a light guide 21, 22 arranged between the input polarizer 17, 18 and the output polarizer 19, 20 in the region of the current conductor 2, said light guide exhibiting the Faraday effect and being configured to feed light transmitted by the input polarizer 17, 18 to the output polarizer 19, 20.

The analysis device 7 is configured to detect for each light guide unit 5, 6 a light intensity of light 9, 10 output by the light guide unit 5, 6 on the output side, and to determine the current intensity of the electric current through the current conductor 2 from the detected light intensities. For this purpose, the analysis device 7 has for each light guide 21, 22 an optical waveguide 23, 24 on the output side (relative to the light guide unit 5, 6) and a photodetector 25, 26. The optical waveguide 23, 24 feeds light 9, 10 output by the light guide 21, 22 to the photodetector 25, 26. The photodetector 25, 26 is configured to detect the light intensity of the light 9, 10 fed to it. Each photodetector 25, 26 is designed as a photodiode, for example. Furthermore, the analysis device 7 comprises an evaluation unit 27, which evaluates the light intensities detected by the photodetectors 25, 26 and ascertains therefrom the current intensity of the electric current through the current conductor 2.

Figure 2:
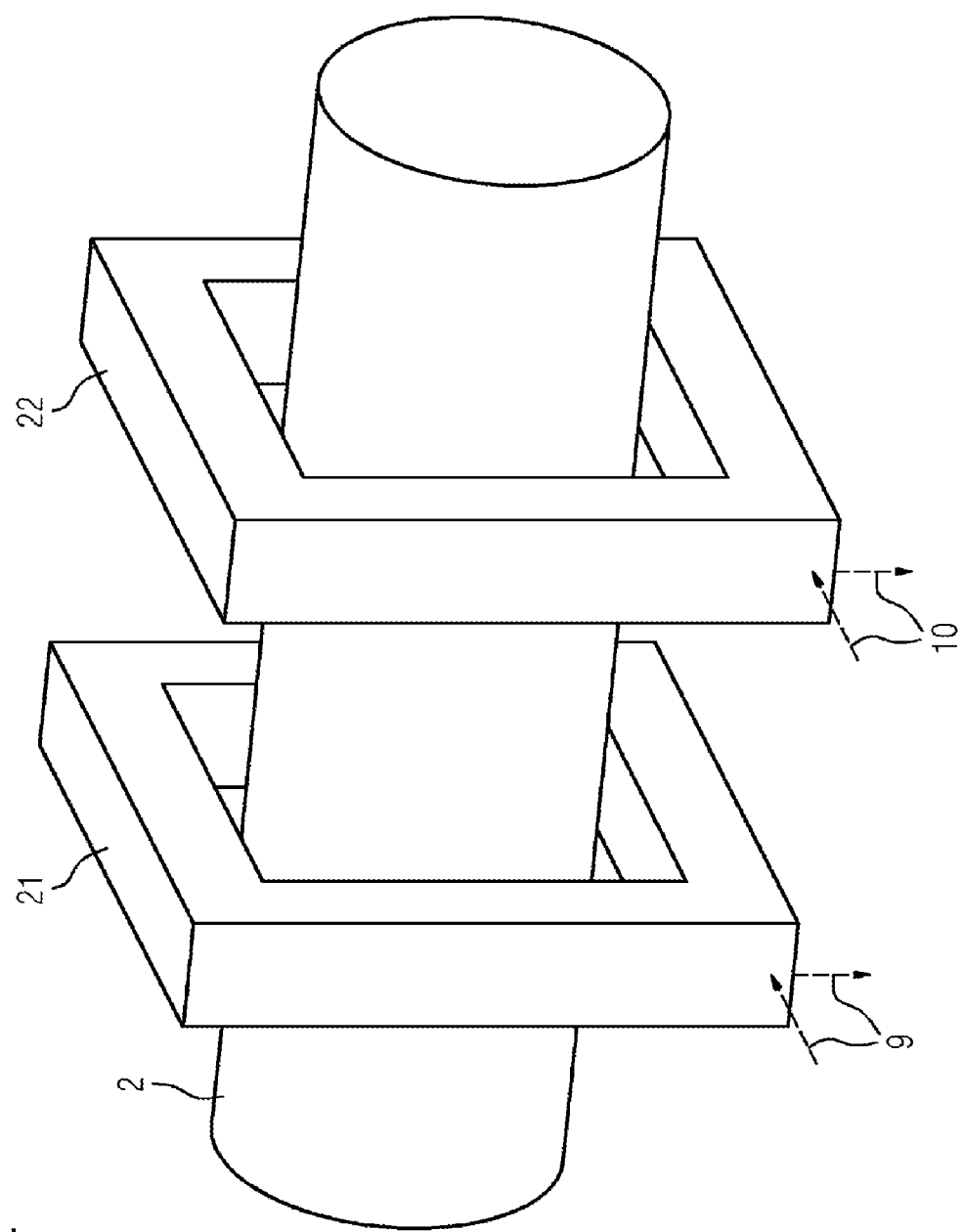
FIG. 2 shows a perspective basic illustration of light guides of one exemplary embodiment of a magneto-optic current transformer.

FIG. 2 (FIG. 2) shows a perspective basic illustration of the light guides 21, 22 of one exemplary embodiment of a magneto-optic current transformer 1. The light guides 21, 22 are embodied identically, run in each case in a ring-shaped manner along a quadrilateral around the current conductor 2 and are fabricated from a glass, for example from optic flint glass. In a departure from FIG. 2, the light guides 21, 22 in the real embodiment have outer surfaces which face away from the current conductor 2 and which are angled by 45 degrees in the corner regions of the respective quadrilateral in order to deflect the light 9, 10 there by 90 degrees by way of total internal reflection. However, the exact embodiment of the light guides 21, 22 is not relevant to the invention and is therefore not illustrated here.

The polarization axis of the output polarizer 19, 20 of each light guide unit 5, 6 is rotated by a polarization angle relative to the polarization axis of the input polarizer 17, 18 of the light guide unit 5, 6, wherein the polarization angles of the two light guide units 5, 6 differ from one another.

By means of the input polarizer 17, 18 of a light guide unit 5, 6, light 9, 10 fed to the light guide unit 5, 6 is linearly polarized parallel to the polarization axis of the input polarizer 17, 18. If a current flows in the current conductor 2, the polarization direction of the light 9, 10 is rotated while passing through the light guide 21, 22 of the light guide unit 5, 6 on account of the Faraday effect. The output polarizer 19, 20 transmits a portion of the light 9, 10 that is parallel to the polarization axis of the output polarizer 19, 20.

The light intensity of the light 9, 10 output by a light guide unit 5, 6 therefore depends on an angle of rotation $\varphi$ by which the polarization direction of the light 9, 10 is rotated when passing through the light guide 21, 22 of the light guide unit 5, 6. Since the light guide units 5, 6 are designed identically, the angle of rotation $\varphi$ is identical for both light guide units 5, 6. Since the polarization angles of the two light guide units 5, 6 differ from one another, however, the proportions of the light transmitted by the output polarizers 19, 20 of the two light guide units 5, 6 differ from one another, however (except for specific angles of rotation $\varphi$). Therefore, the normalized light intensities output by the light guide units 5, 6 also differ from one another, wherein the normalized light intensity output by a light guide unit 5, 6 is defined as the ratio $I/I_{max}$ of the light intensity I of the light 9, 10 output by the light guide unit 5, 6 to a maximum light intensity $I_{max}$ attained if the polarization direction of the light 9, 10 after passing through the light guide 21, 22 of the light guide unit 5, 6 is parallel to the polarization axis of the output polarizer 19, 20 of the light guide unit 5, 6.

FIG. 3 (FIG. 3) shows characteristic curves I1, I2 for the normalized light intensities which are output by the light guide units 5, 6 in the case where a first light guide unit 5 has a polarization axis of 45 degrees and the second light guide unit 6 has a polarization axis of 90 degrees. In this case, I1 denotes the characteristic curve of the first light guide unit 5 and I2 denotes the characteristic curve of the second light guide unit 6. Each characteristic curve I1, I2 indicates the normalized light intensity as a function of the angle of rotation $\varphi$, which indicates the extent to which the polarization direction of the light 9, 10 is rotated when passing through the light guide 21, 22 of the respective light guide unit 5, 6.

Since the first light guide unit 5 has a polarization angle of 45 degrees in the example considered here, the characteristic curve I1 has a minimum of normalized light intensity zero at −45 degrees (modulo 180 degrees), since at $\varphi=-45°$ the polarization direction of the light 9 at the output polarizer 19 is orthogonal to the polarization axis of the output polarizer 19, and a maximum of normalized light intensity one at 45 degrees (modulo 180 degrees), since at $\varphi=45°$ the polarization direction of the light 9 at the output polarizer 19 is parallel to the polarization axis of the output polarizer 19. Accordingly, the characteristic curve I2 has a minimum of normalized light intensity zero at $\varphi=0°$ (modulo 180 degrees) and a maximum of normalized light intensity one at φ=90° (modulo 180 degrees) since the second light guide unit 6 has a polarization axis of 90 degrees in the example considered here.

From FIG. 3, a number of advantages of the use of two light guide units 5, 6 having different polarization axes can be elucidated by way of example. For example, FIG. 3 shows that the characteristic curve I1 yields identical values for the angles of rotation φ=30° and φ=60° (or more generally for φ=45°−α and φ=45°+α), such that these values are not distinguishable by way of the first light guide unit 5 alone. The same correspondingly applies for example to the angles of rotation φ=−60° and φ=−30° (or more generally for φ=−45°−α and φ=−45°+α). In other words, if only the first light guide unit 5 were used, the measurement range would have to be restricted for example to the angle range [−45°, 45°] or to the currents associated therewith in the current conductor 2 in order that a current intensity of a current in the current conductor 2 is unambiguously assigned to a normalized light intensity output by the first light guide unit 5. The additional use of the second light guide unit 6 makes it possible to extend this measurement range, however, since the characteristic curve I2 of the second light guide unit 6 has different values for example for the angles of rotation φ=30° and φ=60° and also φ=−60° and φ=−30° and thus makes it possible to resolve the ambiguity of the characteristic curve I1 at these angles of rotation.

Furthermore, the use of two light guide units 5, 6 having different polarization angles can be utilized for identifying defects of the current transformer 1. By way of example, in the case where only the first light guide unit 5 is used, it is not possible to distinguish between the case of an angle of rotation of φ=−45° (or an angle of rotation close to φ=−45°) and the case where a light feed to the first light guide unit 5 fails or is interrupted (for example owing to a defect of the optical waveguide 15, of the optical waveguide 23 and/or a failure of the light source 11). Additionally taking account of the second light guide unit 6 makes it possible to draw such a distinction, however, since the characteristic curve I2 of the second light guide unit 6 at φ=−45° assumes a value that is distinctly different from zero.

Furthermore, there is no value of the angle of rotation φ for which both characteristic curves I1, I2 assume a vanishing normalized light intensity. If no light intensity is detected for both light guide units 5, 6, a defect of the current transformer 1 can therefore be deduced.

Furthermore, the two characteristic curves I1, I2 define a difference characteristic curve $\Delta I(\varphi) = I1(\varphi) - I2(\varphi)$ for all values of the angle of rotation φ. A great deviation from the difference characteristic curves $\Delta I(\varphi)$ by a difference between the light intensities detected for the two light guide units 5, 6 can thus likewise indicate a defect of the current transformer 1. In particular, a tolerance range R for said difference can be predefined as a range around the difference characteristic curve $\Delta I(\varphi)$ and a defect of the current transformer 1 can be deduced if the difference between the normalized light intensities detected for the two light guide units 5, 6 lies outside the tolerance range R. In this case, the width of the tolerance range R around the difference characteristic curve $\Delta I(\varphi)$ takes into account for example the measurement accuracies of the detection of the light intensities.

Although the invention has been more specifically illustrated and described in detail by way of preferred exemplary embodiments, nevertheless the invention is not restricted by the examples disclosed and other variations can be derived therefrom by a person skilled in the art, without departing from the scope of protection of the invention.

The invention claimed is:

1. A magneto-optic current transformer for detecting a current intensity of an electric current in a current conductor, comprising:
    two light guide units, each having a linear input polarizer, a linear output polarizer and a light guide arranged between the linear input polarizer and the linear output polarizer in a region of the current conductor, said light guide exhibiting a Faraday effect and being configured to feed light transmitted by the linear input polarizer to the linear output polarizer,
    a light supply device configured to feed light to the light guide units on an input side, and
    an analysis device configured to detect for each light guide unit a light intensity of light output by the light guide unit on an output side, and to determine the current intensity of the electric current through the current conductor from detected light intensities,
    wherein a polarization axis of the linear output polarizer of each light guide unit is rotated by a polarization angle relative to a polarization axis of the linear input polarizer of the light guide unit, and the polarization angles of the two light guide units differ from one another.

2. The magneto-optic current transformer as claimed in claim 1,
    wherein the light guides of the two light guide units are embodied identically.

3. The magneto-optic current transformer as claimed in claim 1,
    wherein the light guide of each of the two light guide units runs around the current conductor in a ring-shaped manner.

4. The magneto-optic current transformer as claimed in claim 1,
    wherein the light guide of each of the two light guide units is fabricated from a glass.

5. The magneto-optic current transformer as claimed in claim 1,
    wherein the absolute value of the polarization angle of at least one light guide unit is at least approximately 45 degrees.

6. The magneto-optic current transformer as claimed in claim 1,
    wherein the analysis device has a photodetector for each light guide unit, said photodetector being configured to detect the light intensity of light output by the light guide unit on the output side.

7. The magneto-optic current transformer as claimed in claim 1,
    wherein the light supply device has a light source for each light guide unit and is configured to feed light generated by the light source to the light guide unit.

8. The magneto-optic current transformer as claimed in claim 7,
    wherein each light source is a light emitting diode.

9. A method for detecting a current intensity of an electric current in a current conductor by a magneto-optic current transformer as claimed in claim 1, comprising:
    feeding light to each of the two light guide units of the current transformer by the light supply device of the current transformer, and
    detecting by the analysis device of the current transformer, for each light guide unit a light intensity of light output by the light guide unit on the output side, and determining the current intensity of the electric current through the current conductor from the detected light intensities.

10. The method as claimed in claim 9,
wherein a tolerance range for a difference between the light intensities detected for the two light guide units is predefined, and a defect of the current transformer is deduced if the difference between the light intensities detected for the two light guide units lies outside the tolerance range.

11. The method as claimed in claim 10,
wherein the tolerance range is predefined depending on the light intensity of light output by one of the two light guide units.

* * * * *